United States Patent

Schmidt et al.

[11] Patent Number: 6,005,450
[45] Date of Patent: Dec. 21, 1999

[54] MICROWAVE OSCILLATOR HAVING AT LEAST ONE ADJUSTMENT PIN

[75] Inventors: Ewald Schmidt, Ludwigsburg; Bernhard Lucas, Mundelsheim, both of Germany

[73] Assignee: Robert Bosch GmbH, Stuttgart, Germany

[21] Appl. No.: 09/029,093

[22] PCT Filed: Jan. 13, 1997

[86] PCT No.: PCT/DE97/00036

§ 371 Date: Feb. 18, 1998

§ 102(e) Date: Feb. 18, 1998

[87] PCT Pub. No.: WO98/00904

PCT Pub. Date: Jan. 8, 1998

[30] Foreign Application Priority Data

Jun. 29, 1996 [DE] Germany .......................... 196 26 214

[51] Int. Cl.$^6$ .................................................. H03B 7/14
[52] U.S. Cl. ................ 331/707 DP; 331/96; 331/107 G; 331/181
[58] Field of Search ........................ 331/56, 96, 107 DP, 331/107 P, 107 G, 107 S, 107 T, 177 R, 181

[56] References Cited

U.S. PATENT DOCUMENTS

| | | | |
|---|---|---|---|
| 3,639,856 | 2/1972 | Kimura et al. | 331/96 |
| 3,878,480 | 4/1975 | Hulderman et al. | 331/96 |
| 3,913,035 | 10/1975 | Havens | 331/107 R |
| 4,048,589 | 9/1977 | Knox et al. | 331/107 R |
| 4,188,590 | 2/1980 | Harp et al. | 331/56 |
| 4,540,955 | 9/1985 | Fiedziuszko | 331/107 DP |

FOREIGN PATENT DOCUMENTS

| | | |
|---|---|---|
| 27 09 210 | 9/1978 | Germany . |
| 28 26 767 | 12/1979 | Germany . |
| 35 18 377 | 11/1986 | Germany . |
| 57-109407 | 7/1982 | Japan . |

*Primary Examiner*—David Mis
*Attorney, Agent, or Firm*—Kenyon & Kenyon

[57] ABSTRACT

A microwave oscillator includes a waveguide that is short-circuited on one side and a diode arranged therein, which receives its supply voltage by way of a coupling pin passed through a waveguide wall. At least one adjustment pin, extends into the waveguide and is adjustable in its penetration depth, for tuning the oscillator frequency. Because the adjustment pin is aligned at an acute angle to the coupling pin, the oscillator frequency can be tuned very precisely.

7 Claims, 1 Drawing Sheet

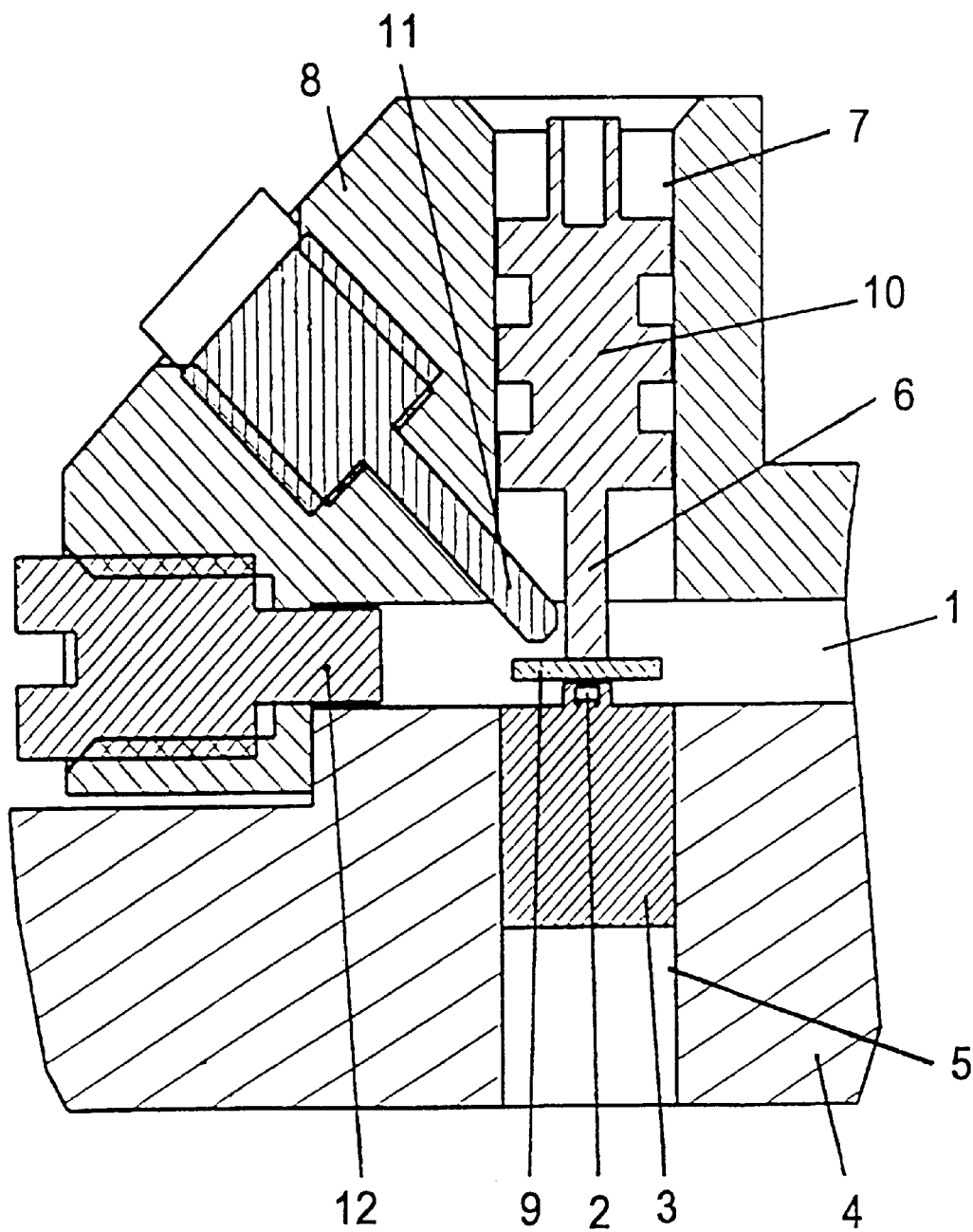

MICROWAVE OSCILLATOR HAVING AT LEAST ONE ADJUSTMENT PIN

FIELD OF THE INVENTION

The present invention relates to a microwave oscillator including of a waveguide that is short-circuited on one side and a diode arranged therein—preferably a Gunn diode—, which receives its supply voltage by way of a coupling pin passed through a waveguide wall, provision being made for at least one adjustment pin, which extends into the waveguide and is adjustable in its penetration depth, for tuning the oscillator frequency.

BACKGROUND OF THE INVENTION

A microwave oscillator having a Gunn diode is disclosed, for example, by German Patent No. DE 28 26 767 B2 or by German Published Unexamined Application No. DE-OS 27 09 210. This related art describes arranging the adjustment pin either in the narrow side or in the wide side of the waveguide supporting the Gunn diode. Thus, in the one case, the adjustment pin is aligned vertically and, in the other case, parallel to the coupling pin feeding the supply voltage to the Gunn diode. Usually, in a microwave oscillator of this kind, the short-circuiting wall of the waveguide is movable, so that the possibility of tuning the oscillator frequency with inductive action is given. This tuning action mainly has an effect on the power output by the oscillator. The adjustment pin that feeds the supply voltage to the Gunn diode is provided in the feed-through orifice to the waveguide with a stop filter (choke), to prevent any oscillator power from leaking off unintentionally through the feed-through orifice.

The object of the present invention is to devise a microwave oscillator whose frequency adjustment will be able to be carried out as simply as possible.

SUMMARY OF THE INVENTION

The object is achieved in accordance with the present invention in that the adjustment pin is aligned at an acute angle to the coupling pin feeding the supply voltage to the diode. This diminishes the balancing responsivity of the oscillator's resonant frequency relative to the known parallel or vertical alignment of the adjustment pin; i.e., the change in resonant frequency depends to a lesser extent on a change in the penetration depth of the adjustment pin into the field around the diode.

It is further advantageous to provide the coupling pin with a cross-sectional change, which forms a resonant circuit, and to align the adjustment pin, between this change in cross-section and a stop filter structure located on the coupling pin, to the coupling pin.

BRIEF DESCRIPTION OF THE DRAWINGS

The FIGURE shows an embodiment of the microwave oscillator according to the present invention.

DETAILED DESCRIPTION

The microwave oscillator illustrated in the FIGURE has a waveguide 1, which is short-circuited on one side and in which is arranged a diode 2, preferably a Gunn diode, which acts as an active oscillator element. This diode 2 is retained by a member 3 acting as a heat sink. Provision is made in one wall of waveguide 1 for an orifice 5, into which member 3 supporting diode 2 is insertable.

Diode 2 is fed the requisite supply voltage via a coupling pin 6. This coupling pin 6 extends through a bushing 7 in waveguide wall 8 opposing diode 2, into waveguide 1, and makes electrical contact with the housing of diode 2. At its diode-side end, coupling pin 6 is provided with a cross-sectional change 9, which forms a resonant circuit. This cross-sectional change 9 can be a disk that is placed on coupling pin 6, or it can be screwed in one piece onto coupling pin 6. In bushing 7, coupling pin 6 has a stop filter structure 10 (choke), which prevents components of the oscillator energy from being coupled out through bushing 7.

To be able to tune the oscillator frequency to a desired value, provision is made for an adjustment pin 11, which extends through waveguide wall 8 into waveguide 1, the penetration depth of adjustment pin 11 being variable. Adjustment pin 11 is aligned at an acute angle to coupling pin 6. This allows adjustment pin 11 to penetrate directly into the resonance chamber of diode 2 located above cross-sectional change 9, and detune the electrical field propagating around diode 2. Due to the inclined configuration of adjustment pin 11, its distance from the outer edge of cross-sectional change 9 is greater than that from the inner region. Since, however, the field concentration at the outer edge of cross-sectional change 9 is considerably greater than in its inner region around coupling pin 6, adjustment pin 6 has a greater influence on the weaker field due to its larger distance from the outer edge and its smaller distance from the inner region of cross-sectional change 9. A greater change in the depth of penetration of adjustment pin 6 into the weaker field is required for a change in the oscillator's resonant frequency than when adjustment pin 6 would primarily influence the higher field concentration. In addition to this, the field concentration above cross-sectional change 9 is generally less than in the area below diode 2. Thus, the balancing responsivity of the oscillator's resonant frequency is diminished with the described configuration, which simplifies the balancing operation. Moreover, the resonant frequency's dependency on the penetration depth of adjustment pin 6 is substantially linear.

Adjustment pin 11—preferably a screw—can be aligned in any desired position around coupling pin 6 between its cross-sectional change 9 and stop filter structure 10. When required for the frequency tuning, provision can also be made for a plurality of adjustment pins in waveguide wall 8 or also in waveguide wall 4.

An additional tuning possibility, especially with respect to the oscillator's power output, is given when the short-circuiting wall of waveguide 1 is designed as screw 12, whose distance from the diode is variable.

What is claimed is:

1. A microwave oscillator comprising:
   a waveguide having a wall, the waveguide being short-circuited on one side;
   a coupling pin passing through the waveguide wall and including a cross-sectional change element in the waveguide wall;
   a diode arranged in the waveguide, the diode receiving a supply voltage via the coupling pin; and
   at least one adjustment pin extending into the waveguide, being adjustable in a penetration depth, tuning an oscillator frequency, and being arranged at an acute angle to the coupling pin, the acute angle being less than 90°,
   wherein the cross-sectional change element and the diode form a resonant circuit,
   wherein the coupling pin has a stop filter structure externally from the waveguide, and
   wherein, when the at least one adjustment pin extends into the waveguide to the penetration depth, a portion of the at least one adjustment pin is arranged between a portion of the cross-sectional change and a portion of the stop filter structure.

2. The microwave oscillator according to claim 1, wherein the diode is a Gunn diode.

3. The microwave oscillator according to claim 1, wherein the waveguide has a movable short-circuiting wall.

4. A microwave oscillator comprising:

a waveguide having a wall, the waveguide being short-circuited on one side;

a coupling pin passing through the waveguide wall;

a diode arranged in the waveguide, the diode receiving a supply voltage via the coupling pin; and at least one adjustment pin extending into the waveguide, being adjustable in a penetration depth, tuning an oscillator frequency, and being arranged at an acute angle to the coupling pin, the acute angle being less than 90°.

5. The microwave oscillator according to claim 4, further comprising:

an adjustment member extending along an extension axis of the waveguide and being provided at a further acute angle from the at least one adjustment pin, the further acute angle being less than 90°.

6. The microwave oscillator according to claim 5, wherein the adjustment member includes a screw.

7. The microwave oscillator according to claim 5, wherein the adjustment member is provided on the one side of the waveguide.

* * * * *